(12) United States Patent
Biloiu et al.

(10) Patent No.: US 10,468,226 B1
(45) Date of Patent: Nov. 5, 2019

(54) EXTRACTION APPARATUS AND SYSTEM FOR HIGH THROUGHPUT ION BEAM PROCESSING

(71) Applicant: Varian Semiconductor Equipment Associates, Inc., Gloucester, MA (US)

(72) Inventors: Costel Biloiu, Rockport, MA (US); Jon Ballou, Beverly, MA (US); James P. Buonodono, Amesbury, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 16/138,343

(22) Filed: Sep. 21, 2018

(51) Int. Cl.
*H01J 37/08* (2006.01)
*H01J 37/04* (2006.01)
*H01J 37/317* (2006.01)

(52) U.S. Cl.
CPC ............ *H01J 37/08* (2013.01); *H01J 37/045* (2013.01); *H01J 37/3171* (2013.01)

(58) Field of Classification Search
USPC ...................................................... 250/492.3
See application file for complete search history.

(56) References Cited

U.S. PATENT DOCUMENTS

| 8,461,030 B2 | 6/2013 | Renau et al. | |
| 2013/0045339 A1* | 2/2013 | Godet | C23C 14/042 427/577 |
| 2016/0064232 A1* | 3/2016 | Berry, III | H01J 37/32009 438/712 |

* cited by examiner

*Primary Examiner* — Kiet T Nguyen (57) ABSTRACT

In one embodiment, an ion extraction optics for extracting a plurality of ion beams is provided. The ion extraction optics may include, an extraction plate, the extraction plate defining a cut-out region, the cut-out region being elongated along a first direction. The extraction apparatus may include a slidable insert, the slidable insert disposed to overlap the cut-out region, and slidably movable with respect to the extraction plate, along the first direction, wherein the slidable insert and cut-out region define a first aperture and a second aperture.

19 Claims, 6 Drawing Sheets

EXTRACTION APPARATUS AND SYSTEM FOR HIGH THROUGHPUT ION BEAM PROCESSING

FIELD

The present embodiments relate to a processing apparatus, and more particularly, to improved apparatus for extracting ions from a plasma.

BACKGROUND

Known apparatus used to treat substrates with ions include beamline ion implanters and plasma immersion ion implantation tools. These approaches are appropriate for implanting ions over a range of energies. In beamline ion implanters ions are extracted from a source, mass analyzed and then transported to the substrate surface. In plasma immersion ion implantation apparatus, a substrate is located in the same chamber the plasma is generated adjacent to the plasma. The substrate is set at negative potential with respect to the plasma and ions crossing the plasma sheath in front of the substrate impinge on the substrate at perpendicular incidence angle.

Recently a new processing apparatus facilitating control of extracted ion angular distribution (IAD) has been developed. In this apparatus ions are extracted from a plasma chamber where the substrate is located proximate the plasma chamber. Ions are extracted through an extraction aperture of special geometry located in an ion extraction optics placed proximate a plasma. To extract an ion beam having controllable and uniform properties, the extraction aperture may be elongated to generate an ion beam having the shape of a ribbon beam when ions are extracted from the plasma. For example, the ribbon beam may have a cross-section having a short dimension as small as a few millimeters, and a long dimension on the order 10 centimeters to 50 centimeters. By exposing a substrate to the ribbon beam and scanning a substrate with respect to the extraction aperture along a direction parallel to the short dimension, an entirety of a large substrate such as a 300 mm wafer may be exposed to ribbon beam.

In such an apparatus, to expose a substrate to a targeted dose of ions, the substrate may be scanned with respect to the extraction aperture at an appropriate velocity to allow each portion of the substrate to receive the targeted dose, given the ion density of the ribbon beam and the size of the ribbon beam. Throughput of substrate processing may accordingly be limited by the size of the extraction aperture along the short dimension, as well as the plasma density or ion density of a plasma chamber generating the ribbon beam. While in principle ion beam current of a ribbon beam delivered to a substrate may be increased by increasing parameters such as the power delivered to the plasma, the increase in power may increase plasma density and consequently undesirably change beam properties of the ribbon beam, such as the angle of incidence of ions or distribution of angles of incidence of the ions. Likewise, while in principle an aperture size along the short dimension of an aperture may be increased, the ability to manipulate and control the geometry of the ribbon beam when the short dimension is increased beyond a few millimeters to a few centimeters may be impractical. With respect to these and other considerations, the present disclosure is provided.

SUMMARY

In one embodiment, an ion extraction optics for extracting a plurality of ion beams is provided. The ion extraction optics may include, an extraction plate, the extraction plate defining a cut-out region, the cut-out region being elongated along a first direction. The extraction apparatus may include a slidable insert, the slidable insert disposed to overlap the cut-out region, and slidably movable with respect to the extraction plate, along the first direction, wherein the slidable insert and cut-out region define a first aperture and a second aperture.

In another embodiment, a processing apparatus may include a plasma chamber disposed to contain a plasma and an extraction plate, disposed along a side of the plasma chamber, the extraction plate defining a cut-out region. The processing apparatus may include a slidable insert, the slidable insert disposed to overlap the cut-out region, the slidable insert being elongated along a first direction and slidably movable along the first direction, wherein the slidable insert and cut-out region define a first aperture and a second aperture. The processing apparatus may also include a first beam blocker, disposed to overlap the first aperture, wherein the first beam blocker and the first aperture define a first extraction slit and a second extraction slit. The processing apparatus may further include a second beam blocker, disposed to overlap the second aperture, wherein the second beam blocker and the second aperture define a third extraction slit and a fourth extraction slit.

In a further embodiment, an ion extraction optics for extracting a plurality of ion beams, is provided. The ion extraction optics may include an extraction plate, the extraction plate defining a cut-out region, the cut-out region being elongated along a first direction. The ion extraction optics may further include N slidable inserts, the N slidable insert disposed to overlap the cut-out region, and slidably movable with respect to the extraction plate, along the first direction, wherein the N slidable inserts define N+1 extraction apertures, within the cut-out region, wherein N is an integer.

DETAILED DESCRIPTION

The embodiments described herein provide apparatus and methods for high throughput ion processing of a substrate using a ribbon beam. The present embodiments provide a novel extraction system to generate ion beams from a plasma in a manner increasing ion current, while preserving spatial uniformity of current as well as the ion beam angular distribution characteristics.

As used herein, the term "angle of incidence" may refer to the mean angle of incidence of a group of ions of an ion beam with respect to the normal on the substrate surface. The term "angular spread" may refer to the width of distribution or range of angles of incidence centered around a mean angle, termed for short. In the embodiments disclosed herein the novel extraction system may increase ion current extracted from a plasma in a ribbon beam configuration, while not affecting ion beam other parameters such as angle of incidence or angular spread.

Figure 1:
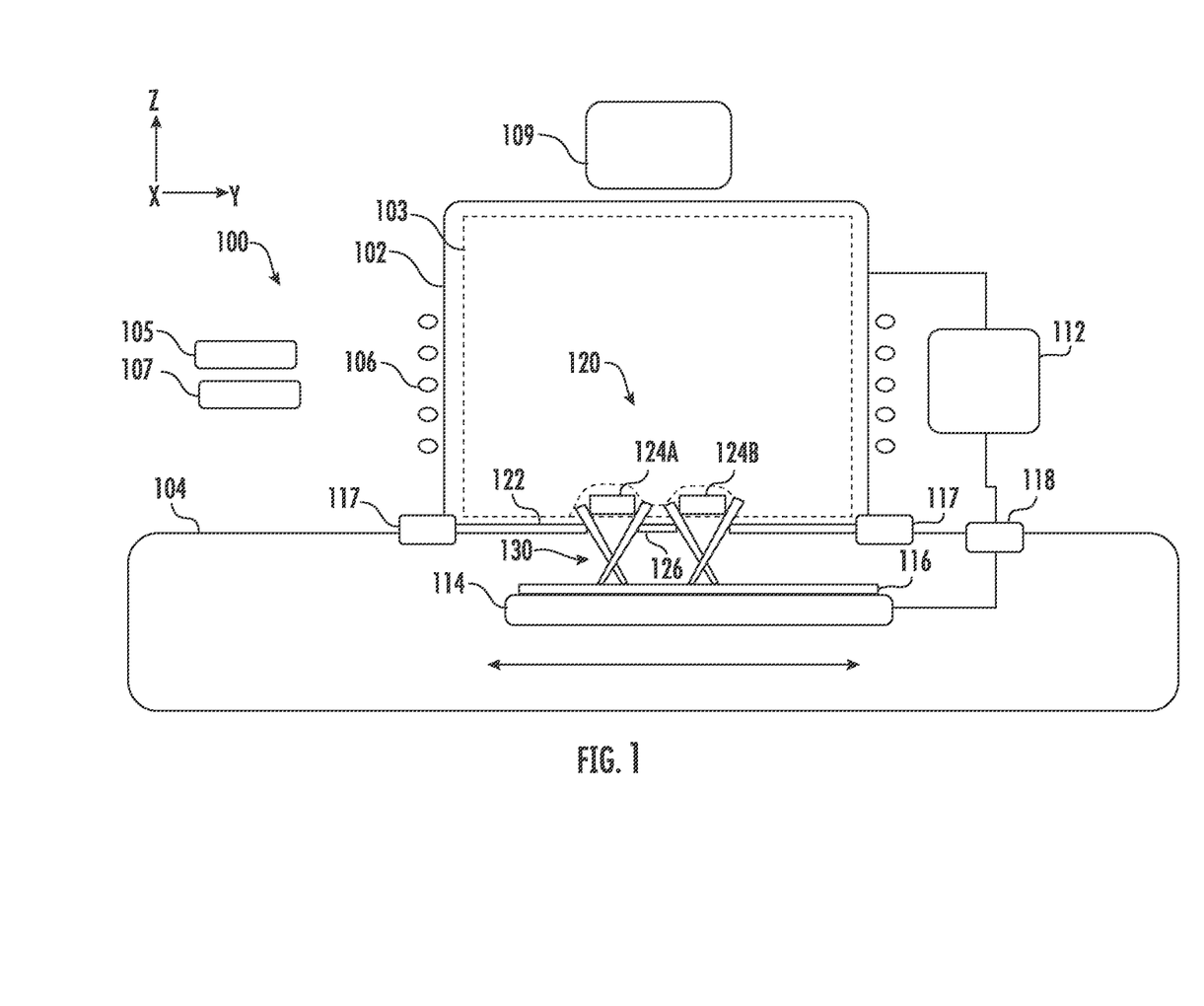
FIG. 1 presents a block diagram of processing apparatus in side view in accordance with various embodiments of the disclosure.

FIG. 1 depicts a processing apparatus 100, in accordance with embodiments of this disclosure. Processing apparatus 100 includes a plasma source comprised of a plasma chamber 102 to generate a plasma 103 in a plasma chamber 102. The plasma chamber 102 may function as part of a plasma source such as an RF inductively-coupled plasma (ICP) source, capacitively coupled plasma (CCP) source, helicon source, electron cyclotron resonance (ECR) source), indirectly heated cathode (IHC) source, glow discharge source, or other plasma sources known to those skilled in the art. In this particular embodiment, the plasma source is an ICP source where the power from an RF generator 105 is coupled into the plasma through an RF matching network 107. The transfer of the RF power from the RF generator to the gas atoms and/or molecules takes places through an antenna 106 and a dielectric window (not shown). A gas manifold 109 is connected to the plasma chamber 102 through appropriate gas lines and gas inlets. The plasma chamber 102 or other components of the processing apparatus 100 also may be connected to a vacuum system (not shown), such as a turbo molecular pump backed by a rotary or membrane pump. The plasma chamber 102 is defined by chamber walls, where the plasma chamber 102 may arranged adjacent to a process chamber 104 and may be electrically insulated by insulators 117. The process chamber 104 chamber includes a substrate holder 114 and the substrate 116. Plasma chamber 102 may be biased with respect to the substrate holder 114 and the process chamber 104 using a bias voltage supply 112. For example, the plasma chamber 102 may be held at elevated voltage, such as +1000 V, while the substrate holder 114, substrate 116, and process chamber 104 are grounded. Alternatively, the substrate holder 114 may be held at negative potential, while the plasma chamber 102 is grounded. Electrical connection between the bias voltage supply 112 and the substrate holder 114 is accomplished through an electrical feedthrough 118. In these scenarios, positive ions may be extracted from the plasma 103 and directed to the substrate 116 at an ion energy proportionate to the difference in voltage between the plasma chamber 102 and the substrate holder 114.

An ion extraction optics 120 may be arranged along a side of plasma chamber 102 as shown in FIG. 1. In FIG. 1, the ion extraction optics 120 is arranged at the bottom of the plasma chamber 102, extending in a horizontal plane. In some embodiments, the plasma chamber 102 may be arranged to the side of the process chamber 104, where the ion extraction optics is arranged along a vertical side of the plasma chamber 102. The ion extraction optics 120 in particular is disposed between the plasma chamber 102 and process chamber 104. The ion extraction optics 120 may define a portion of a chamber wall of the plasma chamber or process chamber or both, in some instances. The ion extraction optics 120 includes an aperture through which ions may be extracted as ion beams and directed toward the substrate 116 which substrate is held by the substrate holder 114.

In various embodiments the substrate holder 114 may be coupled to a drive (not shown) configured to move the substrate holder 114 along a direction parallel to the Y axis of the Cartesian coordinate system shown. In further embodiments, the substrate holder 114 may be movable along a direction parallel to the X-axis, Z-axis, or both. This movement provides the processing apparatus 100 with two degrees of freedom, i.e., allows relative position of the substrate vs an extraction aperture to be modified and allows the substrate 116 to be scanned with respect to an aperture so ions may be provided over the entire surface of substrate 116 in some instances. In various embodiments, the substrate holder 114 may be rotatable around the Z axis in small increments, such as increments of 1 degree, so process uniformity can be improved even more.

In various additional embodiments, and as detailed below, the ion extraction optics 120 may include separate portions defining a plurality of ion beams. In various embodiments, the ion extraction optics 120 defines a plurality of extraction slits, elongated along the X direction (into the plane of figure in FIG. 1). These extraction slits define a plurality of ribbon beams, elongated along the X-direction and having designed properties, such as ion energy, ion current density, designed angle of incidence with respect to the Z-axis, and designed angular spread. As detailed below, by providing multiple extraction slits, such as four slits or more, the ion current delivered to the substrate 116 may be increased, while not affecting other beam properties.

As further illustrated in FIG. 1, the ion extraction optics 120 may include an extraction plate 122, as well as slidable insert 126. In particular embodiments, the ion extraction optics 120 may further include a first beam blocker 124A and a second beam blocker 124B, arranged proximate to apertures defined by the extraction plate 122 and slidable insert 126, explained in more detail below. According to various embodiments, in the configuration of FIG. 1, the extraction plate 122, slidable insert 126, first beam blocker 124A, and second beam blocker 124B may define four extraction slits. These four extraction slits may generate four different ribbon beams, shown as ion beams 130 in FIG. 1. By careful arrangement of the extraction plate 122, slidable insert 126, first beam blocker 124A, and second beam blocker 124B, increased throughput for processing of the substrate 116 may be obtained, while maintaining stable operation of the ion beams 130.

Figure 2A:
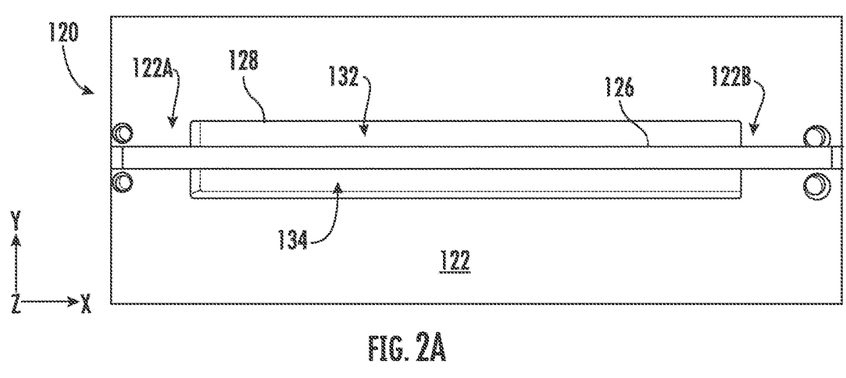
FIG. 2A shows a plan view of a variant of an ion extraction optics, according to embodiments of the disclosure.

Turning now to FIG. 2A there is shown a plan view of a variant of the ion extraction optics 120, according to embodiments of the disclosure. The view of FIG. 2A is shown from the perspective of a process chamber 104, looking towards the plasma chamber 102. As shown, the extraction plate 122 includes a cut-out region 128, where the cut-out region 128 is elongated along a first direction, in this case, along the X-axis. The cut-out region 128 may be elongated to the extent to generate an ion beam having a length approximately the same as the length of the cut-out region 128, such as 100 mm, 200 mm, 300 mm, or 400 mm.

The embodiments are not limited in this context. The cut-out region 128 may further be arranged to have a width along a second direction, perpendicular to the first direction, such as along the Y-axis, as shown. The width of the cut-out region 128 along the Y-axis may be designed to generate a footprint sized to overlap a region of uniform plasma in the plasma chamber 102. Said differently, the cut out region 128 may be located in the middle of a side of the plasma chamber 102, where the width of the cut-out region 128 along the Y-axis is less than or equal to the width of a region where the plasma is uniform along the Y-axis. In this manner, a plurality of ion beams may be extracted from the cut-out region 128 where the ion current density and angular characteristics do not differ among the different ion beams.

As further shown in FIG. 2A, the slidable insert 126 is disposed to overlap the cut-out region 128, while also extending beyond the cut-out region 128 along the X-axis. As such, the slidable insert 126 and the cut-out region 128 define a first aperture 132 and a second aperture 134. In some embodiments, the slidable insert 126 may be positioned to generate the first aperture 132 and the second aperture 134 to have equal size to one another. As discussed in more detail below, the slidable insert 126 may be independently movable with respect to the extraction plate 122. In particular, the slidable insert 126 may be slidably movable with respect to the extraction plate 122. As explained below, during operation of a processing apparatus to generate ion beams using the ion extraction optics 120, the slidable insert 126 may expand or contract in a manner where the slidable insert 126 moves with respect to the extraction plate 122 in the X direction. While under some operating conditions, this expansion or movement of the slidable insert 126 may take place on a small scale, such as 1 mm or less for a 500 mm long version of the slidable insert 126, such movement may relive local thermal stress otherwise generated were the slidable insert 126 rigidly coupled to the extraction plate 122.

In various embodiments, the extraction plate 122 and the slidable insert 126 may be made of electrically conductive material, such as a metal, graphite, or other conductor. According to various embodiments where the extraction plate 122 is made from a first material, the slidable insert 126 may be made of the first material, or of a second material, different from the first material.

Figure 2B:
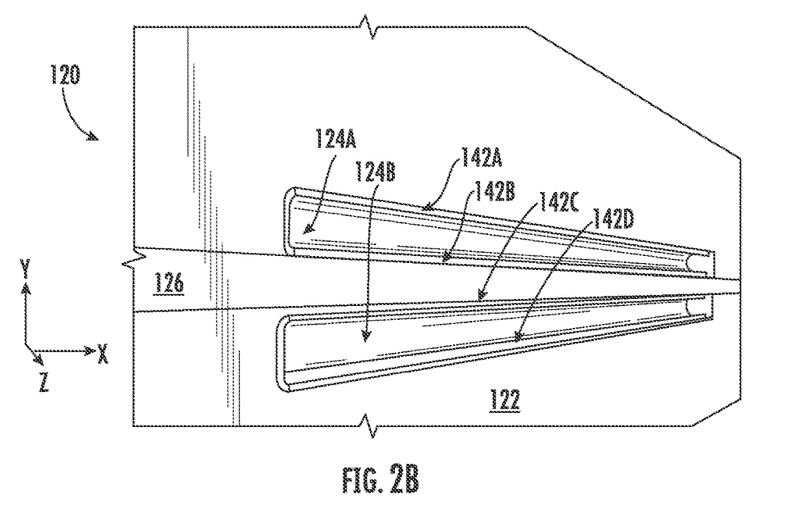
FIG. 2B shows a perspective view of the ion extraction optics of FIG. 2A.

Turning to FIG. 2B, there is shown a perspective view of the ion extraction optics 120, again from the perspective of the process chamber 104. In this example, the first beam blocker 124A and the second beam blocker 124B are in place. With reference also to FIG. 2A, the first beam blocker 124A is disposed to overlap a first portion of the first aperture 132, wherein the first beam blocker 124A and the first aperture 132 define a first extraction slit 142A and a second extraction slit 142B. Likewise, the second beam blocker 124B is disposed to overlap a second portion of the second aperture 134, wherein the second beam blocker 124B and the second aperture 134 define a third extraction slit 142C and a fourth extraction slit 142D. In some examples, an individual width of the extraction slits (142A, 142B, 142C, and 142D) may be on the order of a few millimeters, one millimeter, or less than one millimeter, while a length of the extraction slits may be on the order of tens of centimeters. Thus, the extraction slits may define elongated apertures where very narrow ribbon beams may be extracted from the plasma chamber 102.

Figure 2C:
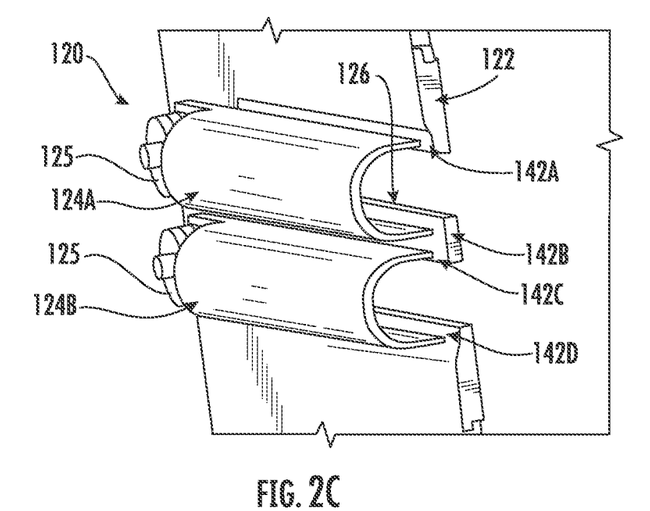
FIG. 2C shows a cross-sectional perspective view of a portion of an ion extraction optics, according to embodiments of this disclosure.

Turning also to FIG. 2C, there is shown a cross-sectional perspective view of a portion of the ion extraction optics 120, shown from the perspective of the plasma chamber 102. As shown, the first beam blocker 124A and the second beam blocker 124B may be disposed on the plasma chamber side of the extraction plate 122, and may have a concave shape in cross-section, facing the first side (plasma chamber side) of the extraction plate 122. The first beam blocker 124A and second beam blocker 124B may be attached to the extraction plate 122 using an elastic mounting 125, for accommodating thermal expansion of the first beam blocker 124A and second beam blocker 124B during operation. The concave shape of the first beam blocker 124A and second beam blocker 124B shape the electrostatic potential field lines and facilitate control of angle of incidence and angular spread of ion beams extracted through the ion extraction optics 120 in embodiments where the first beam blocker 124A and second beam blocker 124B are independently biasable with respect to the extraction plate 122. While the first beam blocker 124A and second beam blocker 124B may be electrical conductors, in some embodiments the first beam blocker 124A and second beam blocker 124B are electrical insulators.

Figure 2D:
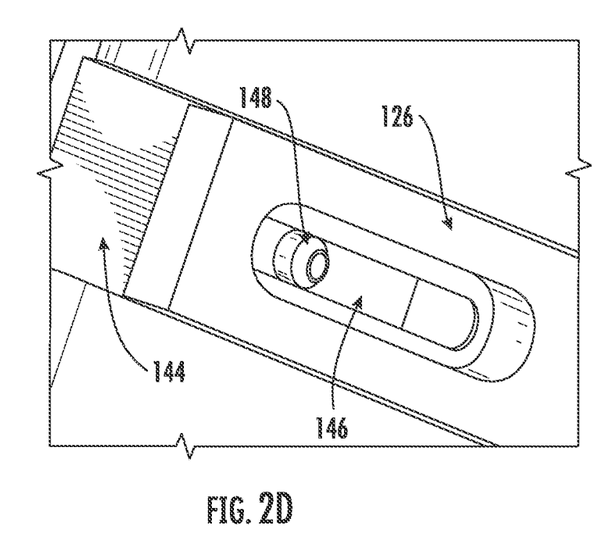
FIG. 2D shows a perspective view of a slidable insert according to embodiments of the disclosure.

In various embodiments, to accommodate thermal expansion of the slidable insert 126, the extraction plate 122 may include a pair of recesses, where FIG. 2D shows one recess, recess 144, in the perspective view. In some embodiments, the recess 144 may be disposed on the process chamber side of the extraction plate 122. The pair of recesses as represented by recess 144 may be disposed on a first side 128A of the cut-out region 128 and a second side 128B of the cut-out region 128, where the recess 144 is arranged to accommodate the slidable insert 126. The recess 144 may be configured as an elongated slot, having a width slightly greater than the width of the slidable insert 126, along the Y-direction.

According to various embodiments, the slidable insert 126 may include a pair of elongated slots, shown in the figure as elongated slot 146, disposed adjacent the recess 144, meaning the pair of elongated slots are disposed toward the ends of the slidable insert 126 to overlap at least a portion of the recess 144, within the extraction plate 122. The ion extraction optics 120 may further include a pair of couplers, shown as coupler 148, disposed within the elongated slot 146, and mechanically coupling the slidable insert 126 to the extraction plate 122. In one example, the coupler may be an alignment pin, held in place at either end by components such as shoulder screws. A function of the coupler 148 and the elongated slot 146 is to allow relative movement of the slidable insert 126 with respect to the extraction plate 122, while maintaining the slidable insert 126 in close proximity to the extraction plate 122. In some embodiments, the slidable insert 126 and the extraction plate 122 may be disposed in a common plane (X-Y plane), such as on the outer side (process chamber side) of the ion extraction optics 120.

Figure 3A:
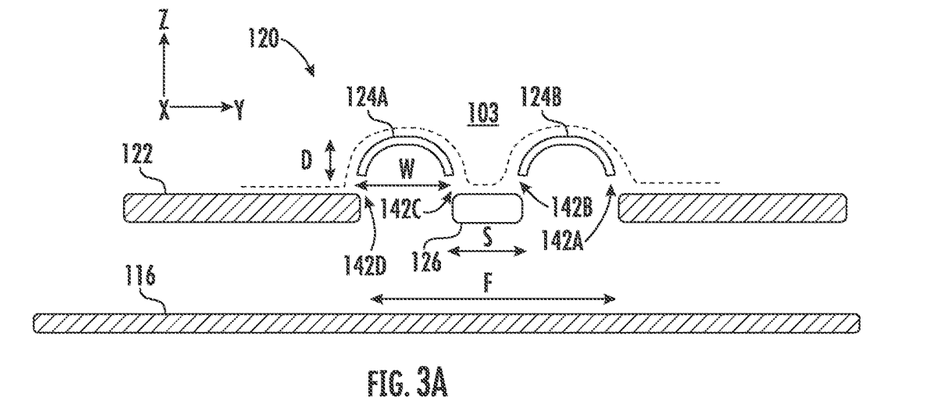
FIG. 3A shows a cross-sectional view of one variant of the ion extraction optics of FIG. 1, showing various geometrical features.

Turning to FIG. 3A there is shown a cross-sectional view of one variant of the ion extraction optics 120, showing various geometrical features. According to some embodiments, the width S of the slidable insert 126 along the Y direction, as well as the depth D of the first beam blocker 124A and the second beam blocker 124B may be arranged to facilitate penetration of the plasma 103 between beam blockers, as shown. For example, the width S of the slidable insert 126 may be 20 mm while the depth D may be 10 mm, allowing the contours of the plasma sheath edge (dashed line) to closely follow the beam blockers and slidable insert 126, as shown. At the same time, the footprint F, equal to the sum of the width S of the slidable insert, and twice the width W of a beam blocker, may be maintained at an acceptable value so the plasma density in the plasma 103 does not vary over the footprint F along the Y-direction. For example, in some non-limiting embodiments, the width W may be arranged to be 20 mm, while the width S of slidable insert 126 may be between 20 mm and 30 mm, generating a footprint of 60 mm to 70 mm. This configuration assures the same plasma density at the various extraction slits, so the ion beam current extracted from the different extraction slits is approximately the same for each extraction slit. Moreover, the compact footprint of 60 mm ensures a given region of the substrate 116 may be exposed to all four ion beams extracted from the four extraction slits, without undue travel. As an example, a 300 mm substrate may be completely exposed to different ion beams extracted from the ion extraction optics 120 by scanning the substrate along the Y-axis with respect to the extraction plate 122 for a total scan distance equal to the width of the substrate (300 mm) plus the width of the footprint F (60 mm), or 360 mm. This compact geometry allows the size of the process chamber 104 to be maintained at an acceptable size, since the process chamber 104 may be sized to accommodate the size of substrate as well as the total scan distance.

Figure 4:
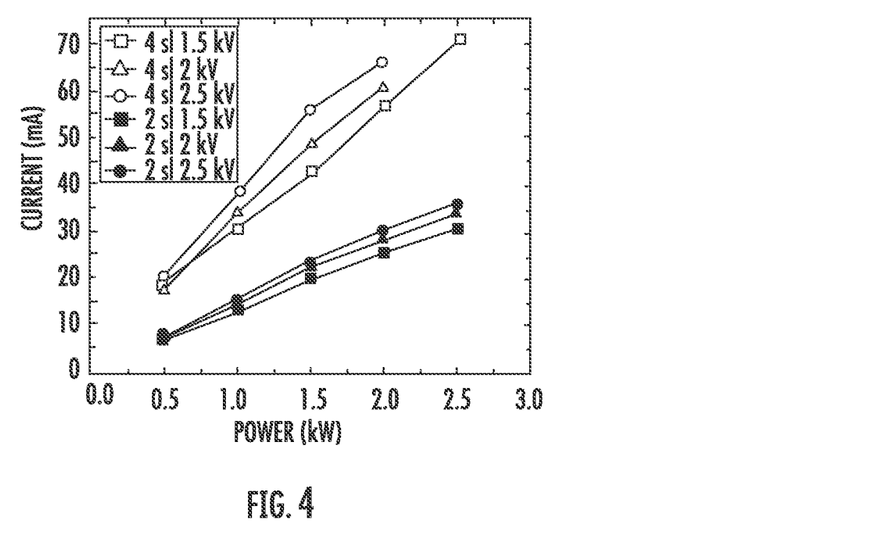
FIG. 4 shows various curves illustrating the extracted beam current as a function of plasma power for known different extraction geometries.
Figure 5:
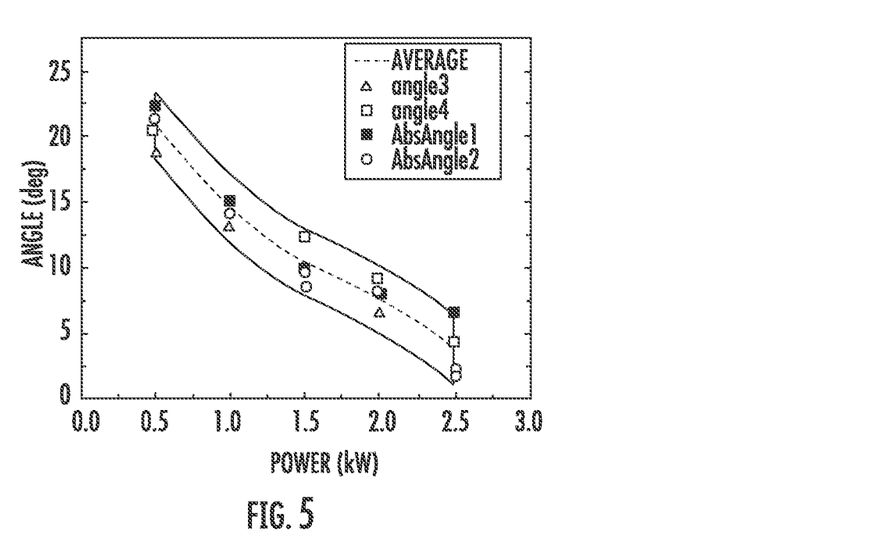
FIG. 5 is a graph illustrating the variation of angle of incidence for an extracted ion beam as a function of plasma power for different extraction geometries.

Turning to FIG. 4 and FIG. 5, there is shown experimental data highlighting the processing advantage of the present embodiments. In FIG. 4, there are shown various curves illustrating the extracted beam current as a function of plasma power for known extraction arrangements having two extraction slits (2 sl) and for extraction assemblies according to the present embodiments, having four extraction slits (4 sl). Each configuration is shown for three different extraction voltages from 1.5 kV to 2.5 kV. As shown, the extracted beam current is a weaker function of increasing extraction voltage and is a stronger function of increasing plasma power. Notably, for most conditions, the four-slit configuration of the present embodiments provides double the current or more than double the current extracted in the two-slit configuration.

While a given level of extracted beam current produced using the four-slit configuration of the present embodiments may in principle be achieved by a known two-slit configuration by increasing plasma power (compared 2 sl 2.5 kW to 4 sl 1.0 kW), the increased plasma power may cause unwanted changes in other beam parameters. FIG. 5 is a graph illustrating the angle of incidence for an extracted ion beam (with respect to a normal to a substrate plane or plane of the extraction plate, meaning with respect to the Z-axis of the figures) as a function of plasma power for the general extraction slit geometry of the two-slit configuration, as well as the four-slit configuration of the present embodiments.

Figure 3B:
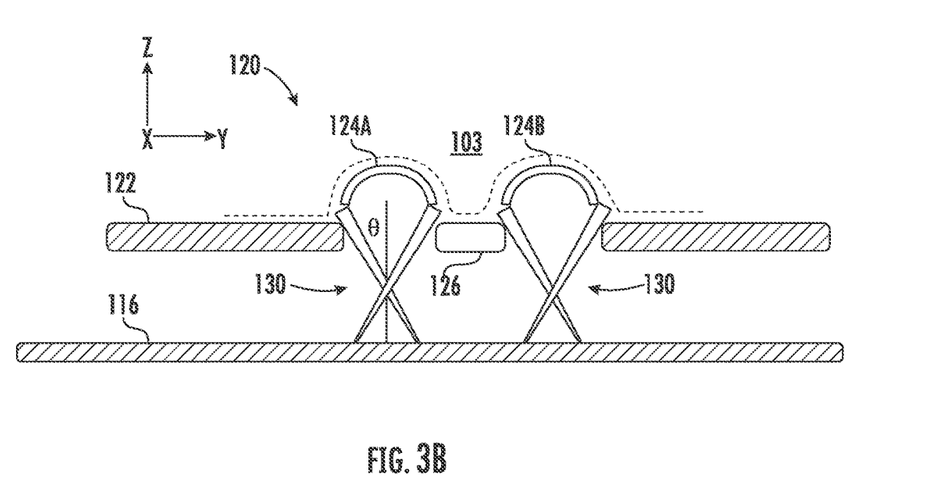
FIG. 3B, shows the extraction geometry of the configuration of FIG. 3A in operation, including a series of ion beams.

Turning also to FIG. 3B, there is shown the extraction geometry of the configuration of FIG. 3A, including a series of ion beams, shown as ion beams 130, extracted through the extraction slits. As shown, the ion beams 130 form a non-zero angle of incidence $\theta$ (+/−) with respect to a perpendicular to a substrate plane (X-Y) axis. While the absolute value of the non-zero angle of incidence for a given condition may be varied by changing the exact configuration of beam blockers and extraction plate, the change of the value of the non-zero angle of incidence is generally a sensitive function of plasma power, as shown in FIG. 5. For the different experimental data of FIG. 5, the average value of $\theta$ at 0.5 kW is approximately 20 degrees, while the average value of $\theta$ at 2.5 kW is just 5 degrees. By providing four extraction slits, a current of 20 mA may be achieved at 0.5 kW, allowing a 20 degree angle of incidence to be maintained, which geometry may be useful to process features of a substrate, such as trenches or sidewalls. In the known two-slit configuration, 0.5 kW power produces merely 8 mA, decreasing processing throughput by more than half. For instance, for an extraction voltage of 1.5 kV, at an angle of 22.5 degrees, the observed beam currents for four-slit geometry of the present embodiments and a two-slit geometry, were 28 mA and 12 mA, respectively. Moreover, in a four-slit geometry of the present embodiments, the slit-to-slit angle variability of the angle of incidence was below 2.5 degrees, while the angular spread was narrower than for dual-slit configuration (~5 degree vs ~7 degree) and decreased with an increase of the extracted ion beam current. Overall beam current uniformity was unaffected by changing between a two-slit configuration and a four-slit configuration and was below 1%.

One issue resulting from the compact geometry of the present embodiments is the relatively narrow width of material separating the first aperture 132 from the second aperture 134. Notably, the present inventors have investigated the effect of various processing conditions in configurations where the first aperture 132 and the second aperture 134 are formed from a unitary extraction plate. Said differently, the material between first aperture 132 and second aperture 134 may be formed in a common plate extending to the outside of the first aperture 132 and second aperture 134, rather than using a slidable insert 126 to define the first aperture 132 and second aperture 134.

Figure 6A:
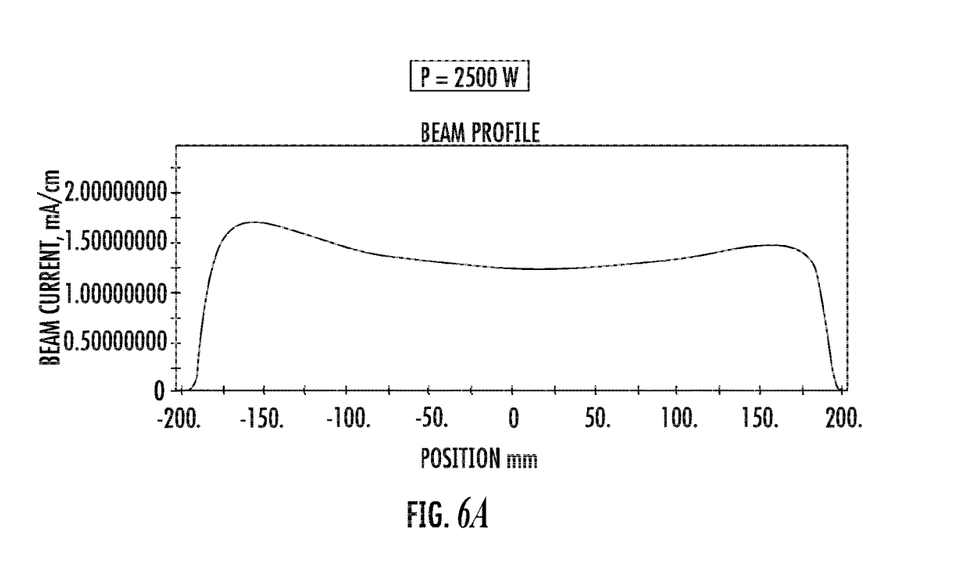
FIG. 6A is a graph illustrating the longitudinal current uniformity observed using one ion extraction optics configuration.

FIG. 6A is a graph illustrating the longitudinal current uniformity observed using an ion extraction optics configuration generally as shown in FIG. 2A and FIG. 2B, except the extraction plate 122 is a unitary plate including a middle portion forming part of the same plate, instead of the slidable insert 126. The current is measured along the X-axis in the long direction of the extraction slits. The example of FIG. 6A is shown for 2.5 kW plasma power. As shown, a pronounced dip in beam current takes place toward the middle of the extraction apertures.

Figure 6B:
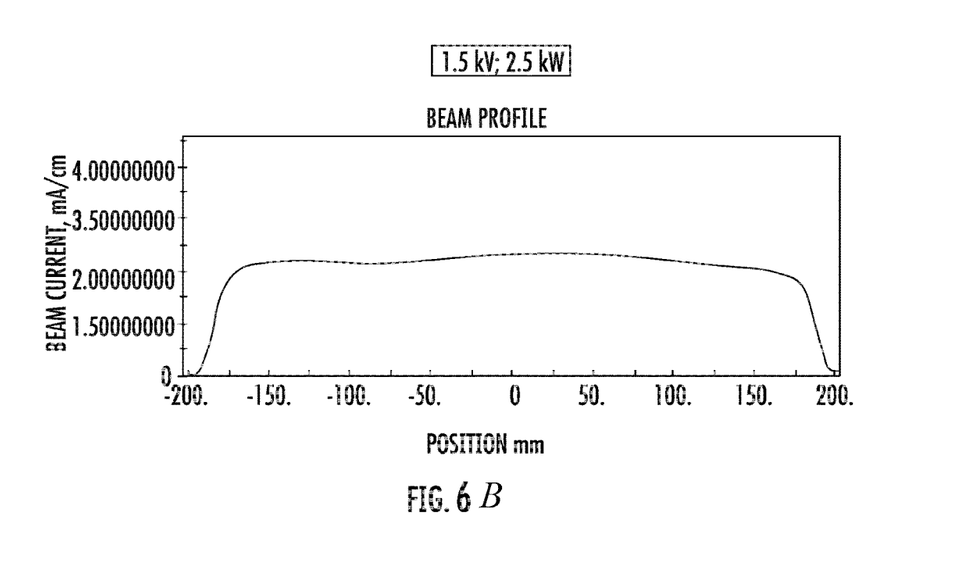
FIG. 6B is a graph illustrating the longitudinal current uniformity observed using an ion extraction optics configuration generally as shown in FIG. 2A and FIG. 2B.

FIG. 6B is a graph illustrating the longitudinal current uniformity observed using an ion extraction optics configuration generally as shown in FIG. 2A and FIG. 2B, at 2.5 kW plasma power and arranged according to the present embodiments with a slidable insert 126. In this example, the longitudinal current uniformity is much more uniform as compared to the example of FIG. 6A. Without being bound by any particular theory, the temperature distribution in material in the region (central strip between extraction apertures has been simulated for various power conditions and materials, such as graphite and titanium. Notably, the temperature may be tens of degrees hotter in the material located toward the center region of the extraction aperture (along the X-direction) as opposed material located toward the ends of the extraction aperture, leading to mechanical deformation of the central strip. Such deformation may locally change the geometry of the extraction slit along the X-direction, leading to non-uniform current distribution as shown. By providing a movable insert, the present embodiments address this problem by relieving any mechanical deformation that may otherwise arise form temperature non-uniformity along the X-direction, since the movable insert is free to expand along the X-direction.

While the aforementioned embodiments focus on four-slit configurations, in additional embodiments, six-slit configurations and eight-slit configurations are possible. For example, a six-slit configuration may be realized wherein two slidable inserts are positioned over a common cut-out region, to define three extraction apertures. Thus, three respective beam blockers may be positioned to overlap the three respective extraction apertures, where a given beam blocker may define a pair of extraction slits with the extraction aperture, as generally shown in FIGS. 1 and 2B. Likewise, an eight-slit configuration may be realized by positioning three slidable inserts over a common cut-out region, to define four extraction apertures, which apertures are paired with four beam blockers. Generally, a multi-slit ion extraction optics according to the present embodiments may be constructed using one cut-out region, N slidable inserts, and N+1 beam blockers, where the number of extraction slits is equal to 2(N+1). Likewise, such a configuration may include N pairs of recesses, N pairs of elongated slots, N pairs of couplers, and so forth.

In further embodiments, a multi-slit extraction system may be defined by an extraction plate having one cut-out region and N slidable inserts, to generate 2(N+1) extraction slits. In these further embodiments, beam blockers may be omitted, wherein the extraction slits are defined by the slidable inserts and the cut-out region. In such additional embodiments, the trajectories of ion beams extracted from the extraction slits may lie along the perpendicular to the substrate (Z-axis) where the "perpendicular to the substrate" means perpendicular to a substrate surface of plane of the substrate extending in the X-Y plane, such as the major surface of a wafer. Thus, in these embodiments these ion beams may impinge upon a substrate at 0 degrees incident angle with respect to the normal to X-Y plane of the substrate. Accordingly, these latter embodiments may be suitable for applications where an angled ion beam (non-normal incidence angle) is not desired or needed.

A first advantage afforded by the present embodiments is the ability to increase beam current and processing throughput in a compact plasma-based ion beam system, in comparison to known 2-slit configurations. Moreover, the beam current may be increased with respect to 2-slit configurations while not lowering the angle of incidence of an ion beam with respect to normal, preserving the ability to process sidewalls and other structures of a substrate at high throughput. A further advantage is the ability to generate uniform beam current along the long direction of a ribbon beam by use of a slidable insert in an extraction plate to define extraction apertures.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that the usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion extraction optics for extracting a plurality of ion beams, comprising:
    an extraction plate, the extraction plate defining a cut-out region, the cut-out region being elongated along a first direction; and
    a slidable insert, the slidable insert disposed to overlap the cut-out region, and slidably movable with respect to the extraction plate, along the first direction, wherein the slidable insert and cut-out region define a first aperture and a second aperture.

2. The ion extraction optics of claim 1, wherein the extraction plate comprises a first material, and wherein the slidable insert comprises the first material.

3. The ion extraction optics of claim 1, wherein the extraction plate comprises a pair of recesses, disposed on a first edge of the cut-out and a second edge of the cut-out, the pair of recesses arranged to accommodate the slidable insert, wherein the slidable insert and the extraction plate are disposed in a common plane, on an outer side of the ion extraction optics.

4. The ion extraction optics of claim 3, the slidable insert further comprising a plurality of elongated slots, disposed adjacent the pair of recesses, the ion extraction optics further comprising a pair of couplers, disposed within the respective pair of elongated slots, and mechanically coupling the slidable insert to the extraction plate.

5. The ion extraction optics of claim 1, further comprising:
    a first beam blocker, disposed to overlap a first portion of the first aperture, wherein the first beam blocker and the first aperture define a first extraction slit and a second extraction slit; and
    a second beam blocker, disposed to overlap a second portion of the second aperture, wherein the second beam blocker and the second aperture define a third extraction slit and a fourth extraction slit.

6. The ion extraction optics of claim 5, further comprising an elastic mounting assembly, the elastic mounting assembly, comprising a plurality of elastic mounts, coupling the first beam blocker and the second beam blocker to the extraction plate.

7. The ion extraction optics of claim 5, wherein the first beam blocker and the second beam blocker are disposed on a first side of the extraction plate, and wherein the slidable insert is disposed on a second side of the extraction plate, opposite the first side.

8. The ion extraction optics of claim 7, wherein the first beam blocker and the second beam blocker comprise a concave shape in cross-section, facing the first side of the extraction plate.

9. The ion extraction optics of claim 5, wherein extraction plate comprises an electrically conductive material, and wherein the first beam blocker and the second beam blocker comprise an electrical insulator.

10. A processing apparatus, comprising:
    a plasma chamber disposed to contain a plasma;
    an extraction plate, disposed along a side of the plasma chamber, the extraction plate defining a cut-out region;
    a slidable insert, the slidable insert disposed to overlap the cut-out region, the slidable insert being elongated along a first direction and slidably movable along the first direction, wherein the slidable insert and cut-out region define a first aperture and a second aperture;
    a first beam blocker, disposed to overlap the first aperture, wherein the first beam blocker and the first aperture define a first extraction slit and a second extraction slit; and
    a second beam blocker, disposed to overlap the second aperture, wherein the second beam blocker and the second aperture define a third extraction slit and a fourth extraction slit.

11. The processing apparatus of claim 10, wherein the extraction plate comprises a pair of recesses, disposed on a first edge of the cut-out and a second edge of the cut-out, the pair of recesses arranged to accommodate the slidable insert, wherein the slidable insert and the extraction plate are disposed in a common plane.

12. The processing apparatus of claim 11, the slidable insert further comprising a pair of elongated slots, disposed adjacent the pair of recesses, the apparatus further comprising a pair of couplers, disposed within the pair of elongated slots, and mechanically coupling the slidable insert to the extraction plate.

13. The processing apparatus of claim 10, further comprising:
   a first beam blocker, disposed to overlap a first portion of the first aperture, wherein the first beam blocker and the first aperture define a first extraction slit and a second extraction slit; and
   a second beam blocker, disposed to overlap a second portion of the second aperture, wherein the second beam blocker and the second aperture define a third extraction slit and a fourth extraction slit.

14. The processing apparatus of claim 10, wherein the first beam blocker and the second beam blocker comprise a concave shape in cross-section, facing a first side of the extraction plate, the first side being adjacent the plasma chamber.

15. The processing apparatus of claim 10, wherein the slidable insert extends through the cut-out region along the first direction for a first length, and wherein the slidable insert has a first width along a second direction, perpendicular to the first direction, a ratio of the first width to the first length being at least 10/1.

16. An ion extraction optics for extracting a plurality of ion beams, comprising:
   an extraction plate, the extraction plate defining a cut-out region, the cut-out region being elongated along a first direction; and
   N slidable inserts, the N slidable inserts disposed to overlap the cut-out region, and slidably movable with respect to the extraction plate, along the first direction, wherein the N slidable inserts define N+1 extraction apertures, within the cut-out region, wherein N is an integer.

17. The ion extraction optics of claim 16, further comprising:
   N+1 beam blockers, disposed to overlap the N+1 extraction apertures, wherein the N+1 beam blockers define 2(N+1) extraction slits.

18. The ion extraction optics of claim 16, wherein the extraction plate comprises N pairs of recesses, disposed on a first edge of the cut-out and a second edge of the cut-out, the N pairs of recesses arranged to accommodate the N slidable inserts, respectively, wherein the N slidable inserts and the extraction plate are disposed in a common plane, on an outer side of the ion extraction optics.

19. The ion extraction optics of claim 18, the slidable insert further comprising N pairs of elongated slots, disposed adjacent the N pairs of recesses, respectively, the ion extraction optics further comprising N pairs of couplers, disposed within the N pairs of elongated slots, respectively, and mechanically coupling the N slidable inserts to the extraction plate.

* * * * *